(12) United States Patent
Lapadatu et al.

(10) Patent No.: US 8,952,479 B2
(45) Date of Patent: Feb. 10, 2015

(54) FOCAL PLANE ARRAY AND METHOD FOR MANUFACTURING THE SAME

(75) Inventors: Adriana Lapadatu, Horten (NO); Gjermund Kittilsland, Horten (NO)

(73) Assignee: SensoNor AS (NO)

( * ) Notice: Subject to any disclaimer, the term of this patent is extended or adjusted under 35 U.S.C. 154(b) by 0 days.

(21) Appl. No.: 13/582,103

(22) PCT Filed: Mar. 1, 2011

(86) PCT No.: PCT/EP2011/053049
§ 371 (c)(1),
(2), (4) Date: Oct. 4, 2012

(87) PCT Pub. No.: WO2011/107486
PCT Pub. Date: Sep. 9, 2011

(65) Prior Publication Data
US 2013/0026596 A1    Jan. 31, 2013

(30) Foreign Application Priority Data

Mar. 2, 2010  (EP) .................................... 10155250

(51) Int. Cl.
*H01L 31/058*        (2006.01)
*H01L 27/146*        (2006.01)
(52) U.S. Cl.
CPC ...... *H01L 27/1467* (2013.01); *H01L 27/14683* (2013.01)
USPC .................................. 257/467; 257/E21.499
(58) Field of Classification Search
CPC .................................................... H01L 27/146
USPC .................. 257/432, 467, E31.113, E29.347; 438/51, 53, 54
See application file for complete search history.

(56) References Cited

U.S. PATENT DOCUMENTS 6,144,030 A * 11/2000 Ray et al. .................... 250/338.4
6,690,014 B1 * 2/2004 Gooch et al. ............... 250/338.4

FOREIGN PATENT DOCUMENTS

| GB | 2 411 521 A | 8/2005 | |
|---|---|---|---|
| WO | 01/09948 A1 | 2/2001 | |
| WO | 01/54189 A1 | 7/2001 | |
| WO | WO 0154189 A1 * | 7/2001 | .................... 250/332 |

OTHER PUBLICATIONS

Niklaus F et al: "MEMS-based uncooled infrared bolometer arrays: a review", Proceedings of the SPIE—The International Society for Optical Engineering SPIE—The International Society for Optical Engineering USA LNKD—vol. 6836, Nov. 29, 2007, pp. 68360D-1, XP002586083, ISSN: 0277-786X.

* cited by examiner

*Primary Examiner* — Yu-Hsi D Sun
*Assistant Examiner* — Christina Sylvia
(74) *Attorney, Agent, or Firm* — Hovey Williams LLP (57) ABSTRACT

A method of forming a focal plane array by: preparing a first wafer having sensing material provided on a surface, which is covered by a sacrificial layer; preparing a second wafer including read-out integrated circuit and a contact pad, which is covered by another sacrificial layer into which are formed support legs in contact with the contact pad, the support legs being covered with a further sacrificial layer; bonding the sacrificial layers of the first and second wafers together such that the sensing material is transferred from the first wafer to the second wafer when a sacrificial bulk layer of the first wafer is removed; defining a pixel in the sensing material and forming a conductive via through the pixel for providing a connection between an uppermost surface of the pixel and the supporting legs; and removing the sacrificial layers to release the pixel, with the supporting legs underneath it.

6 Claims, 7 Drawing Sheets

FOCAL PLANE ARRAY AND METHOD FOR MANUFACTURING THE SAME

The present invention relates to the manufacture of focal plane arrays and, in particular, the manufacture of a focal plane array for use in a thermal imaging device, using transfer bonding of sensing material.

The resolution of an imaging device is very much dependent on the number of pixels provided in its focal plane array. The number of pixels is, in turn, limited by the dimensions of the focal plane array.

In existing focal plane arrays, pixels are generally supported by legs that extend from opposing sides. However, legs arranged in this way occupy valuable space within the focal plane array, which limits the amount of sensing material available and hence limits the performance of the imaging device.

Accordingly, an aim of the present invention is to provide a focal plane array in which the active sensing area is maximised.

According to the present invention there is provided a method of forming a focal plane array comprising one or more pixels, the focal plane array being fabricated by:
preparing a first wafer having sensing material provided on a surface, which is covered by a first sacrificial layer;
preparing a second wafer including read-out integrated circuit (ROIC) and a contact pad, which is covered by a second sacrificial layer into which are formed one or more support legs in contact with the contact pad, the support legs being covered with a further sacrificial layer;
bonding the sacrificial layers of the first and second wafers together such that the sensing material is transferred from the first wafer to the second wafer when a sacrificial bulk layer of the first wafer is removed;
defining a pixel in the sensing material above each of the one or more support legs and forming a conductive via through each pixel defined for providing a connection between an uppermost surface of the pixel and its support legs; and
removing the sacrificial layers to release the one or more pixel, each of the one or more pixels being defined such that its support legs are arranged to be completely beneath the sensing material of the pixel.

The support legs are free-standing and act as mechanical support to separate the pixel from the ROIC substrate while ensuring that the active sensing area is maximised, due to the legs being arranged to be completely beneath the sensing material of each pixel in the focal plane array. The legs also provide an electrical connection for each pixel to the ROIC lying beneath the focal plane array.

As the pixel legs do not take up any space to the sides of the pixels, the total area of active sensing material can be maximised in an array when compared to the area available in an array having conventional pixels with legs at their sides.

Furthermore, focal plane arrays manufactured according to the method of the present invention are two level-structures, which are realised by use of wafer bonding. In addition to maximising the active sensing area available, the present invention also provides a manufacturing method which enables a plurality of vacuum encapsulated focal plane arrays to be formed simultaneously at wafer level on a single ROIC substrate, which can subsequently be diced to provide individual focal plane arrays.

The wafer-level transfer of the sensing material onto the ROIC allows the utilisation of high performance crystalline materials, which could not previously be used due to the layer-wise construction of the pixels required.

According to the method of the present invention, a high performance focal plane array having peak responsivity in the 7 to 14 μm wavelength region can be achieved. The array resolution is typically in the range of quarter VGA to full VGA, but is not limited to this range. Pixel pitch for this wavelength is typically in the range 13 to 40 μm.

An example of the present invention will now be described with reference to the accompanying figures, in which.

Figure 1:
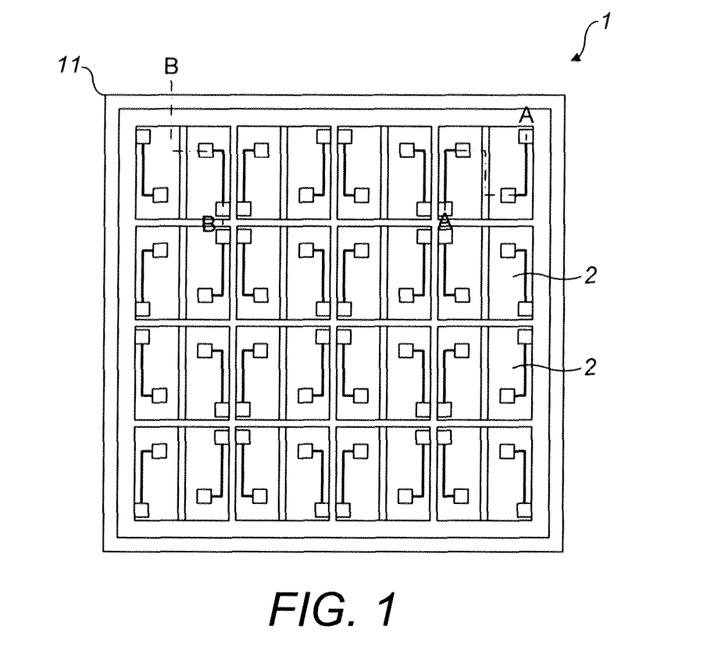
FIG. 1 is a plan view of a focal plane array (FPA) according to an example of the present invention.

FIG. 1 shows a plan view of a focal plane array (FPA) 1, according to the present invention, before sealing, the FPA comprising a plurality of pixels 2 arranged in an array. The focal plane array 1 of this example is suitable for a thermal imaging device and hence each pixel 2 is a bolometer pixel comprising sensing material 3, which in this example consists of a thermistor built as a layer stack of, for example, Si and SiGe with contacting and buffer layers, as will be described in detail below.

The material for the thermistor 3 is chosen on the basis that it has a strong temperature dependent resistivity. Energy absorbed in the layers generates heat, resulting in a measurable change in the thermistor 3 resistance. Absorption of the infra-red (IR) waves 6 is enhanced by the introduction of an absorber layer 4 positioned on an upper surface of the thermistor 3 at a wavelength optimised distance from a reflector layer 5 that is deposited on the reverse side of the thermistor 3, as can be seen in FIG. 2.

Once the FPA 1 has been formed, as will be described below, a cap wafer 10 is sealed, in a vacuum, over the FPA 1 and thus heat transfer from the pixels 2 to the surroundings is low. A bonding frame 11 is provided around the FPA 1 for the cap wafer 10 to be sealed onto.

The pixels 2 arranged around the outer edge of the FPA 1 are thermally-shorted or "blind", reference pixels. In addition, the FPA may also contain temperature sensors and vacuum level sensors. The analogue signals from the pixels 2 are converted to digital format by read-out integrated circuitry (ROIC) provided on a ROIC wafer 9 and this information is used to present an image.

Figure 2:
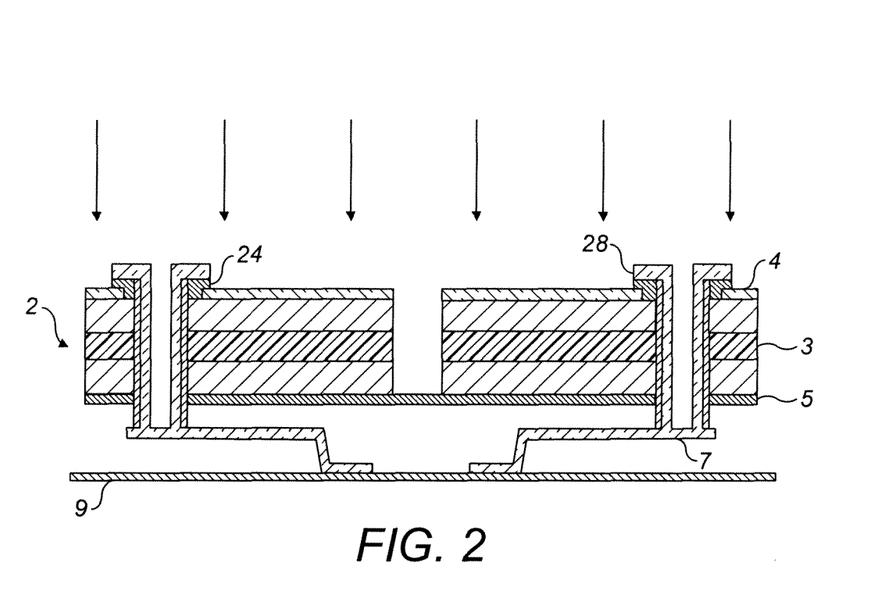
FIG. 2 is a schematic representation of a pixel of the focal plane array of FIG. 1, taken through section A-A.

FIG. 2 shows a schematic representation of a section (A-A) of the FPA in FIG. 1 showing the basic structure of a typical pixel 2 formed by the method of the present invention. In particular it can be seen how each pixel 2 is spaced apart from the ROIC wafer 9 by free-standing supporting legs 7 that are provided underneath the pixel 2. These legs 7 provide the dual function of acting as mechanical supports for the pixel 2, as well as providing an electrical connection between the pixel 2 and the ROIC lying beneath it on the ROIC wafer 9. Both the material and design of the pixel legs 7 are selected to ensure that heat transfer from the pixel 2 to the surroundings is minimised.

Figure 3:
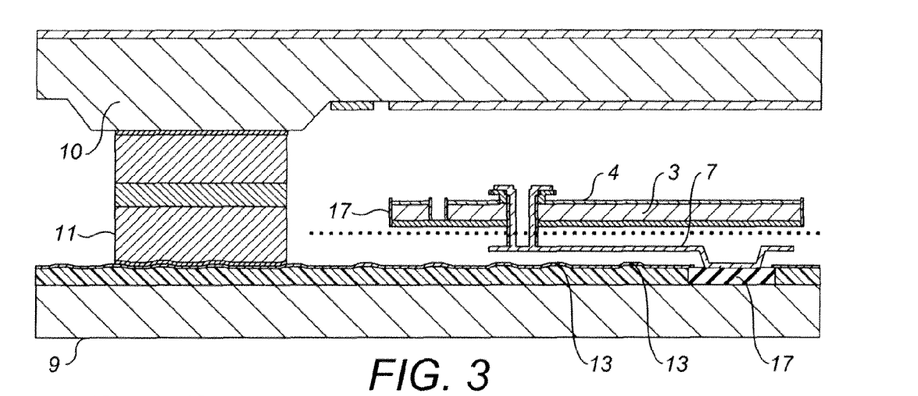
FIG. 3 is a representation of a sectional view through a pixel sealed within the focal plane array of FIG. 1, taken through section B-B.

FIG. 3 is a schematic representation of a section (B-B) of the FPA in FIG. 1 showing a resulting pixel 2 formed by the method of the present invention. In all of the following figures, the pixels 2 are represented according to section B-B of FIG. 1, although it should be understood that the pixels 2 are actually defined as two halves, as shown in the representation of FIG. 2. The pixels are mirrored across a trench 16 that is etched into the IR wafer 8, as will be described below.

It can be seen from FIG. 3 that a bonding frame 11 structure for supporting the cap wafer 10 is provided to the side of the pixel 2. The capped FPA 1 starts out as three separate wafers: an ROIC wafer 9, an IR wafer 12 including the thermistor material 3, and a cap wafer 10. The IR wafer 12 and ROIC wafer 9 are joined by transfer bonding of the thermistor material 3 to form the pixels 2, which are then sealed by the cap wafer 10 using a suitable bonding method, such as Cu—Sn bonding, to bond it to the bonding frame 11.

The ROIC wafer 9 is pre-fabricated using standard CMOS processing technology, which is well known and hence not further described here. However, irregularities are shown on the top surface 13 of the ROIC wafer 9 to illustrate a typical top surface topography that might result from standard CMOS processing.

The IR wafer 8, in this example, is created by using a standard silicon-on-insulator (SOI) wafer 12 having a BOX layer 14, and a device layer having a thickness appropriate for being a first, highly doped p+ Si layer in a layer stack that forms the sensing material 3. Of course, any suitable carrier may be used in place of the SOI wafer. The rest of the layers, including the required doping layer, are built by epitaxial growth of single crystalline Si and SiGe to create quantum well layers on top of the un-patterned SOI wafer. These quantum well layers thereby provide an IR sensitive thermistor material 3. Single or multiple quantum well layers may be used depending on performance requirements.

The thermistor material 3 used in the IR wafer 12 is, preferably, based on a material concept described in U.S. Pat. No. 6,292,089 and consists of single crystal Si and SiGe quantum well layers. This thermistor 3 material has a high temperature coefficient of resistance as well as low noise characteristics, and is fully compatible with standard CMOS processes. Highly doped p+ Si layers (around 1019 cm$^{-3}$) are used on both sides of the quantum well layers structure to provide ohmic contacts to the thermistor 3. Furthermore, an undoped Si barrier layer must exist between the highly doped p+ Si layers and the quantum well layers. SOI wafers and their formation are well known in the art. In this example of the present invention, the total thickness of all layers provided above a BOX layer 14 of the SOI wafer 12 should be wavelength optimised, which for the present invention will be, ideally, around 0.5 to 0.7 μm.

The manufacturing process of the present invention will now be described in detail with reference to a single pixel 2, although it will be understood that a plurality of pixels can be formed in an array, simultaneously, using this method.

FIG. 4 shows the steps for preparing the pre-fabricated ROIC wafer 9 (a) for bonding, including forming the supporting legs 7. First, a thin insulator layer 16 of, for example, $Al_2O_3$ is deposited (b), preferably by atomic layer deposition (ALD) on the surface of the ROIC wafer 9. This insulator layer 16 will serve as an etch barrier against vapor HF used at a later stage to release the pixels 2. However, this insulator layer 16 needs to be removed from the metal ROIC pads 17 of the ROIC wafer 9 and hence it is also patterned by lithography and etched (b). The etching should stop at the underlying metal ROIC pads 17, but selectivity is typically not critical at this step (commonly used pad materials are AlSi, AlCu or AlSiCu).

Following the above process steps, a low temperature oxide layer 18 is deposited (c) on the ROIC wafer 9 using, for example, plasma-enhanced chemical vapor deposition (PECVD), and then polished to planarize it. Contact windows 19 to the metal ROIC pads 17 are then opened by etching through the oxide layer 27 (d). Next, a thin film material 7 is deposited and patterned (e) to form legs for the pixel 2. The flatness of the legs 7 relies on the level of planarity ensured by the first oxide deposition (c) and the subsequent polishing. A further layer of low temperature oxide 18 is then deposited (f) and polished to planarize it. At this point, the ROIC wafer 9 is ready for bonding to the IR wafer 8.

Figure 4A:
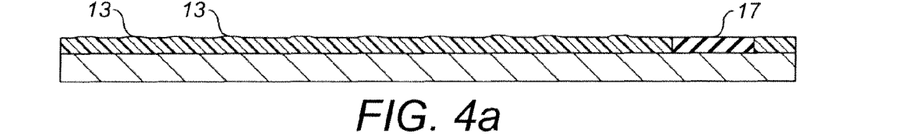
FIG. 4 shows the steps for preparing a pre-processed read-out integrated circuit (ROIC) for transfer bonding.
Figure 4B:
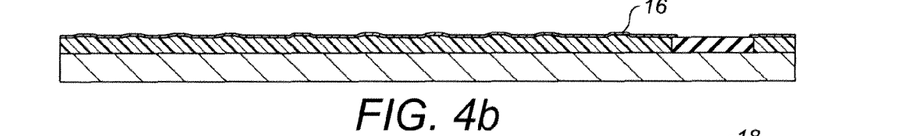
Figure 4C:
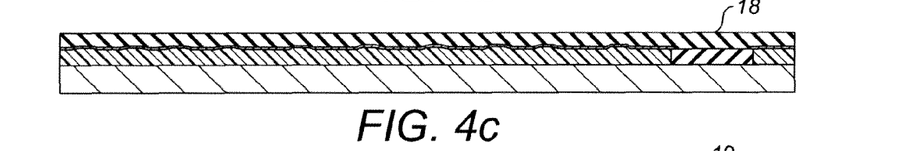
Figure 4D:
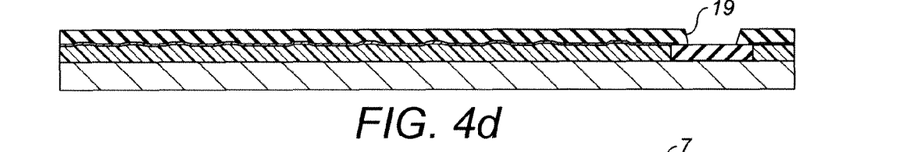
Figure 4E:
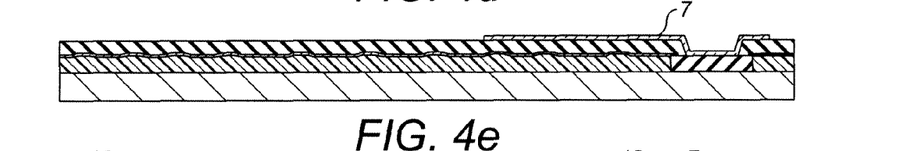
Figure 4F:
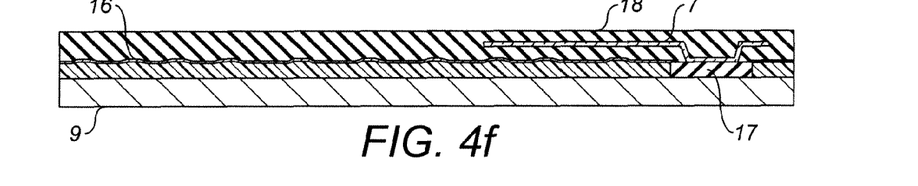

An alternative procedure is to first planarize the ROIC wafer 9 surface by depositing a low temperature oxide having a thickness greater than the topography of the wafer surface 13 using, for example PECVD. This oxide layer is then polished to planarize it and then contact holes are etched through it, down to the ROIC metal pads 17. Following this, a metal layer can be deposited and patterned to act as the ROIC contact pads and the above described steps (b) to (f) are then followed. In this alternative, the insulator layer 26 is deposited on a planarized surface instead of a surface with irregularities 13.

A further alternative process is to reorder the steps of the process such that the patterning of the insulator layer in step (b) is instead combined with step (d), after step (c), as a double etch process, such that the patterning of the ALD layer can be performed after the contact windows are opened.

As discussed above, the material for the legs 7 must be selected to provide them with mechanical strength to support the pixel 2, ensure a good electrical connection, whilst preventing heat conduction, between the pixel 2 and the ROIC on the ROIC wafer 9 via the legs 7. This material must also withstand the subsequent etching of the sacrificial oxide layers to release the pixels 2. An example of a suitable material for the legs 7 is amorphous TiAl.

Figure 5A:
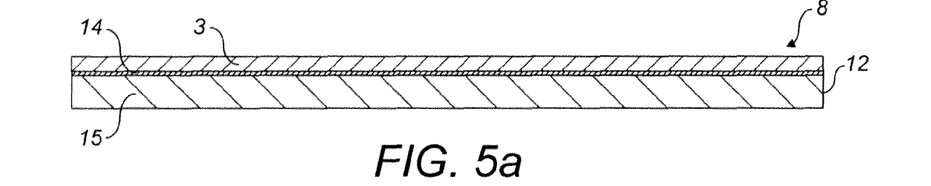
FIG. 5 shows the steps for forming an infra-red (IR) wafer prior to transfer bonding of the thermistor material.
Figure 5B:
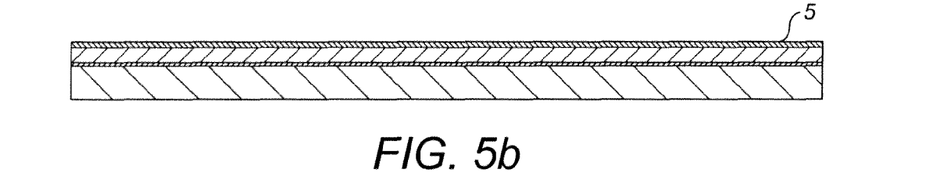
Figure 5C:
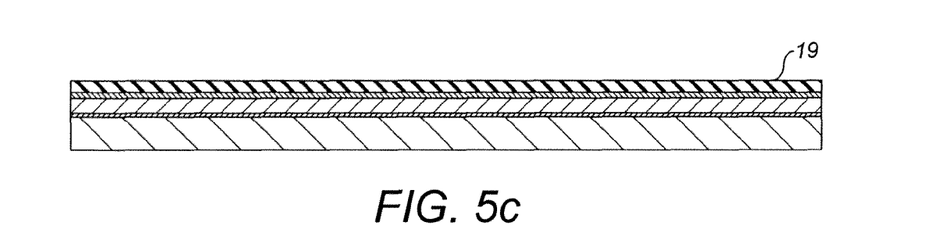

FIG. 5 shows the steps for processing the IR wafer 8. First, an IR wafer is provided (a), as described above. A thin film metal layer 5, for example AlSi or TiAl, is deposited (b) to act as a reflector layer 5, which is also used for ohmic contact. Following the metal layer deposition, a low temperature oxide 19 is deposited (c) by, for example, plasma-enhanced chemical vapor deposition (PECVD) and then polished to planarize it. At this point the IR wafer 8 is ready to be bonded to the ROIC wafer 9.

Figure 6:
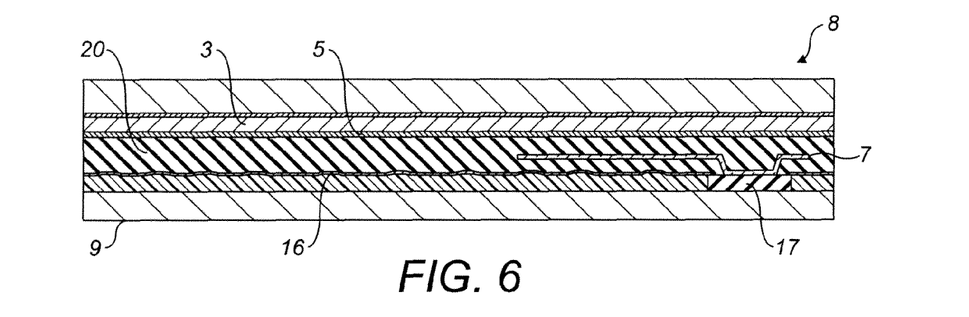
FIG. 6 is a sectional view of a pixel structure after the IR wafer has been bonded to the ROIC wafer.

FIG. 6 shows the IR wafer 8 and the ROIC wafer 9 joined together by using a transfer bonding process, during which the two wafers 8, 9 are bonded together and the IR sensitive thermistor layer 3 and the reflector layer 5 are transferred to the ROIC wafer 9. The wafer bonding process uses oxide-oxide bonding between the oxide layer 19 on the IR wafer 8 and the oxide layer 18 on the ROIC wafer 9, performed at temperatures less than 400° C., to form a bonded oxide layer 20.

Alternatively, the IR wafer 8 and ROIC wafer 9 can be bonded together by providing an adhesive on at least one of the oxide layers 18, 19.

Figure 7:
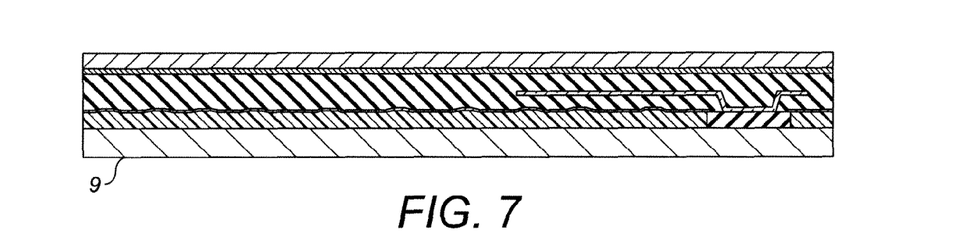
FIG. 7 is a sectional view through the pixel structure after the thermistor material has been transferred to the ROIC wafer.

FIG. 7 shows the combined IR and ROIC wafers after removal of the sacrificial handle layer 15 and the BOX oxide layer 14 of the original SOI wafer 12 that was used to create the IR wafer 8. Removal of these sacrificial layers 14, 15 is preferably by grinding and/or etching. Following removal of these sacrificial layers 14, 15, the thermistor 3, comprising the thin stack of Si and SiGe layers, has effectively been transferred from the IR wafer to the ROIC wafer.

FIG. 8 shows the steps for defining the pixels 2 and creating a conductive contact 21 between the upper side of the pixels 2 and the supporting legs 7.

First, a first thin film material, for example $MoSi_2$ or TiAl, is deposited (a) over the thermistor layer 3 to act as an absorber layer 4 in the 7-14 µm range of the electromagnetic spectrum. An oxide layer 22 is, preferably, then sputtered on top of the absorber layer 4, to protect it during a mask-less etching of the insulator layer which follows. The oxide layer 22 may be considered optional, however, depending on the conditions of the etch processes involved. A contact window 23 is then etched (b) into the oxide layer 22 and the absorber layer 4 at a point above the supporting legs 7 and a conductive thin-film material 24, for example AlSi, is then deposited (c) on the surface of the thermistor layer 3 and the oxide layer 22 that are immediately adjacent to the walls of the contact window 23 to form a top-side contact 24. Next, a trench 25 is etched (d) into the oxide layer 22, the absorber layer 4 and the thermistor layer 3, at a position to the side of the contact window 23, for separating the pixel 2 into two halves.

Figure 8A:
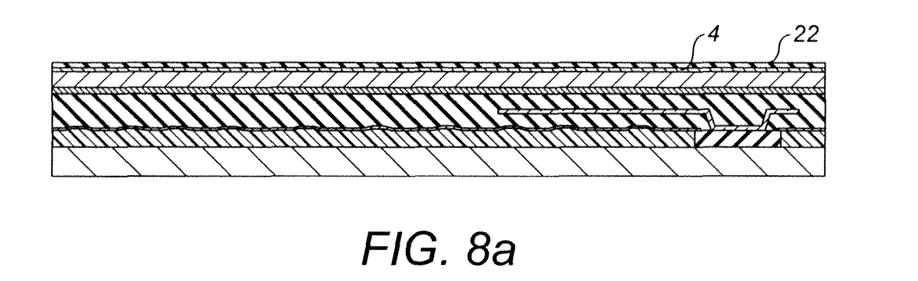
FIG. 8 shows the process steps for defining a pixel and forming a conductive contact plug through it.
Figure 8B:
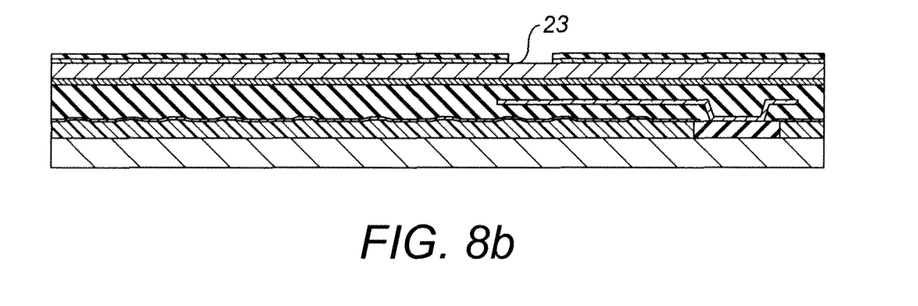
Figure 8C:
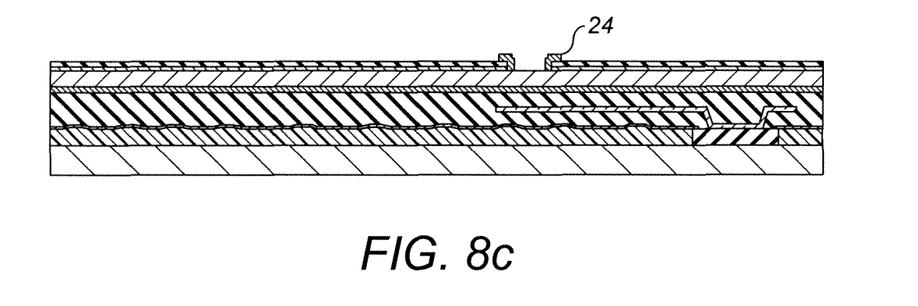
Figure 8D:
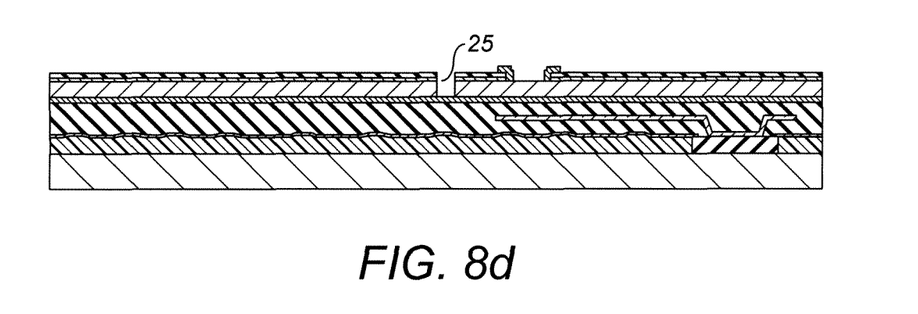
Figure 8E:
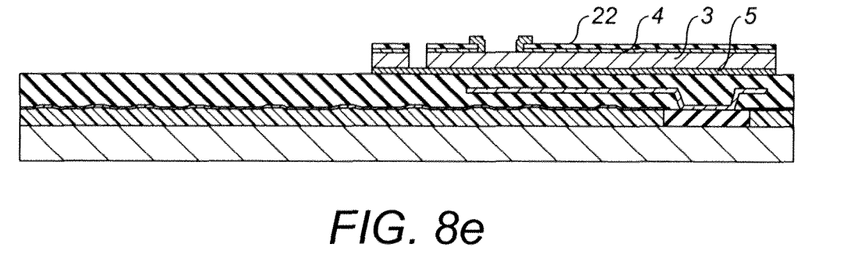
Figure 8F:
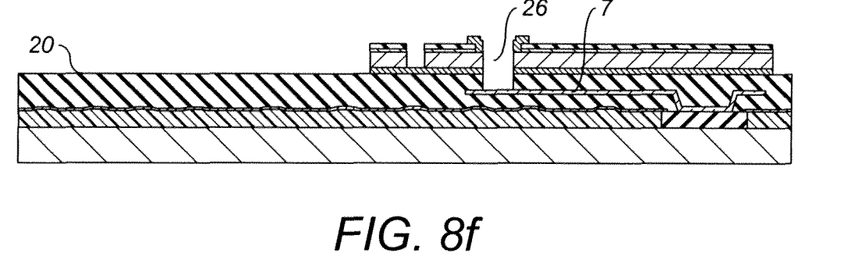

The outline of the pixel 2 is then defined (e) by etching through the oxide layer 22, the absorber layer 4, the thermistor layer 3 and the reflector layer 5. Next, the contact window 23 is extended down through the pixel 2 to the underlying supporting legs 7, formed within the ROIC wafer 9, by etching through the thermistor layer 3, the reflector layer 5 and the bonded oxide layer 20 to form a via 26.

A skilled person will recognize that the etching processes described herein include etching steps that are common to several of them. The etching steps are, however, performed separately in order to minimize the fill factor loss caused by the inaccuracies of the alignment between the different lithography layers.

Figure 8G:
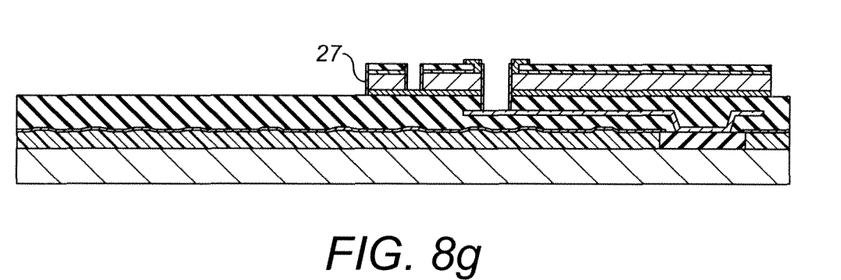
Figure 8H:
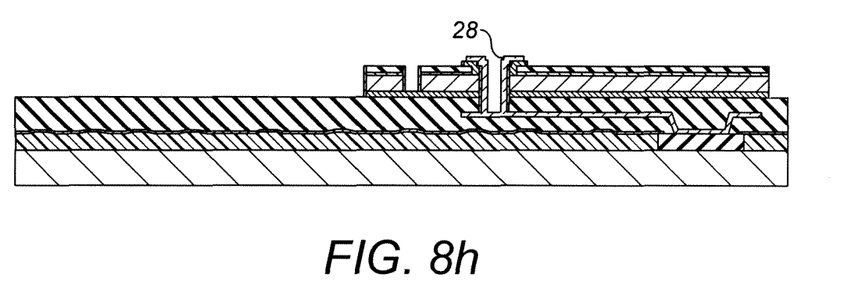
Figure 9A:
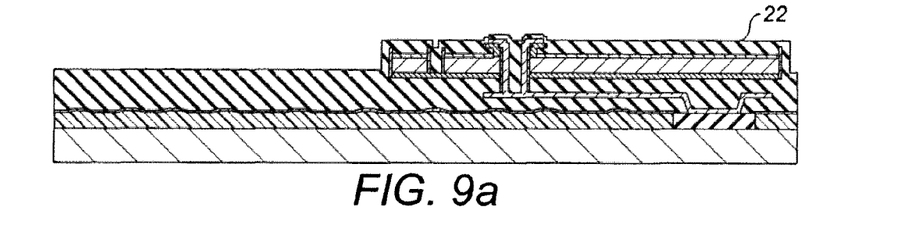
FIG. 9 shows the process steps for or ing a bonding frame on the ROIC wafer.
Figure 9B:
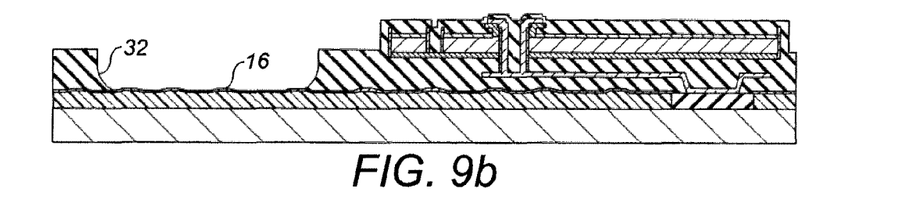
Figure 9C:
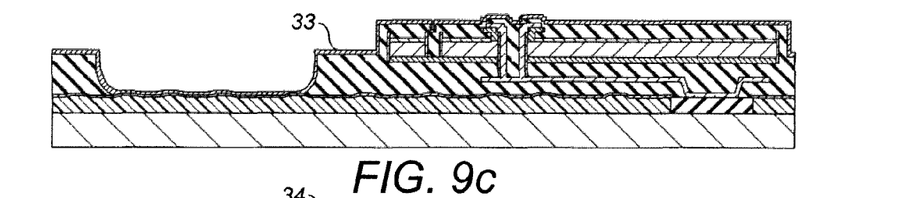
Figure 9D:
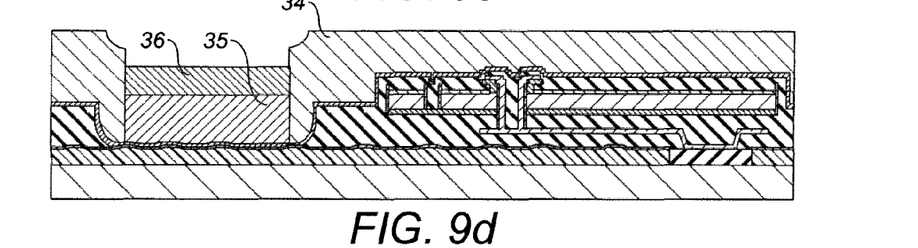
Figure 9E:
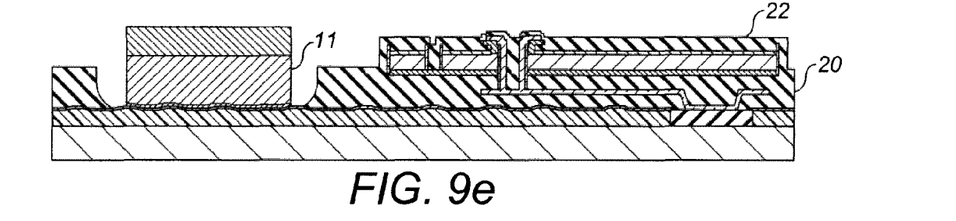

A thin layer of insulator material 27, for example $Al_2O_3$, is then deposited, preferably by atomic layer deposition (ALD) over the exposed surfaces, and then patterned such that it is removed from all the horizontal surfaces and kept on the vertical ones (g). The insulator layer 27 provided on the sidewalls of the via 26 provides electrical insulation to the thermistor material 3. Finally, a conductive contact 28 is defined (h) by metal deposition, for example TiAl, and then patterned.

The insulator layer 27 can optionally be kept on top of the absorber layer 4, although performance of the pixel 2 decreases somewhat if it is not removed. In this alternative, a further patterning is required to etch open a contact window in the insulator layer 27 to allow the etching of the sacrificial bonded oxide layer 20 underneath the pixel 2 in order to release it later on.

FIG. 9 illustrates a bonding frame 11 being formed on the ROIC wafer 9, the bonding frame 11 being arranged around the perimeter of a focal plane array 1 to prepare it for encapsulation by a cap wafer 10. The bonding frame 11 is formed as follows. Oxide layer 32 is built up by additional oxide being deposited over the surface of the pixel structure, which is then patterned (a) such that it covers the area of the pixels 2 to protect them from the deposition of a metal layer 33 that follows, as will be explained below. Next, a contact window 32 is etched (b) into the oxide layer 22 down to the insulator layer 16 which was previously deposited on the ROIC wafer 9 during its preparation. A thin metal layer 33, for example TiW/Cu is then deposited (c) on the exposed surfaces of the ROIC wafer 9 and the oxide layer 22. The metal layer 33 serves as a seed and adhesive for electroplating that follows. First, however, a thick electroplating resist is deposited 34 and patterned before materials 35, 36 that are suitable to form the bonding frame 11, such as Cu and Sn, are electroplated (d) onto the surface of the ROIC wafer 9 within the contact window 32 to form the bonding frame 11. Finally, the electroplating resist 34 and the exposed metal layer 33 are removed (e), leaving the bonding frame 11 ready to receive the cap wafer 10.

Figure 10:
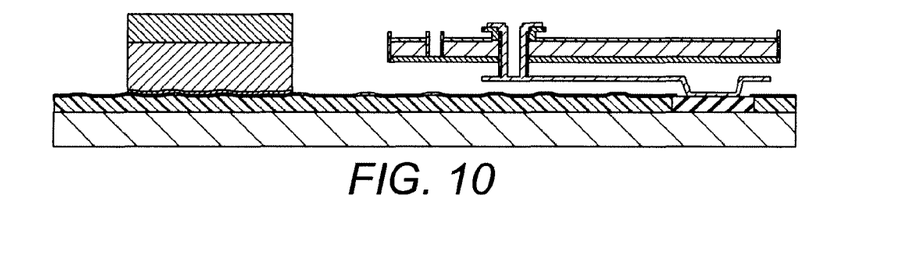
FIG. 10 is a sectional view of a released pixel ready for cap wafer sealing.

FIG. 10 shows the last step in defining the pixels 2, which is the removal of the sacrificial oxide layers 20, 22 to release the pixels 2. The sacrificial oxide layers 20, 22 are preferably removed using anhydrous vapor HF, which is compatible with all of the exposed materials. Following the release of the pixels 2, the FPA 1 is ready for cap bonding. Given the fact that at the moment of cap bonding the pixels 2 are already released, no wet chemical treatment of the wafers is allowed because of the fragility of the FPA 1.

FIG. 11 shows the steps of forming the cap wafer 10 for encapsulating the FPA 1 under vacuum to reduce heat transfer away from the pixels 2. The cap wafer 10 used for the hermetic vacuum encapsulation of the focal plane array is required to transmit the incident IR waves. Both Si and Ge exhibit high optical transmittance in the wavelength range of interest and are therefore both suitable for this purpose. However, the thermal expansion coefficient of Ge is high compared to that of Si, which will result in high thermal residual stresses being induced in the bonded materials and thus Si is the preferred choice. Selecting the thickness of the cap wafer 10 is a trade off between the need to minimize the absorption, wherein the thinner the wafer the better, and the requirements of safe handling during processing. The cap wafer 10 can be formed as follows.

Figure 11A:
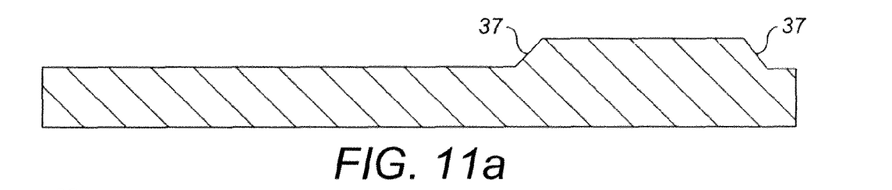
FIG. 11 shows the steps for forming a cap wafer for sealing the focal plane array.

First, cavities 37 are etched (a) into the cap wafer, which is done for a number of reasons, such as: to accommodate the different thin films required by the functionality of the focal plane array, as described below; to cope with bowing of the cap wafer that results from the atmospheric pressure pressing from the top side of the cap; and to provide a sufficient distance above wire bonding pads that are provided outside the sealed cap (not shown) to allow subsequent sawing for the release of these pads.

Figure 11B:
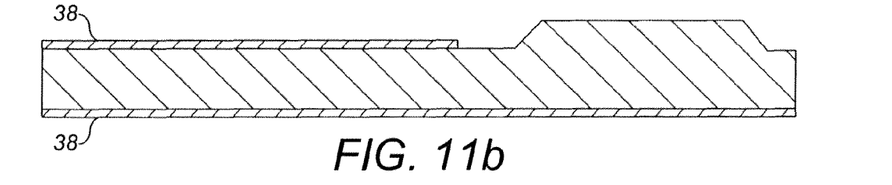
Figure 11C:
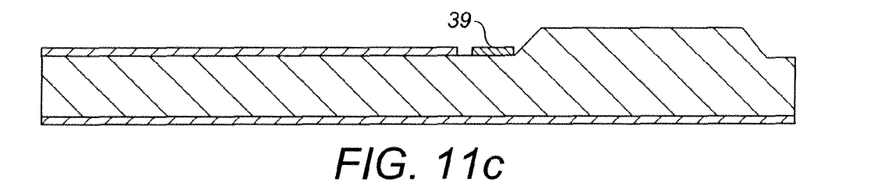
Figure 11D:
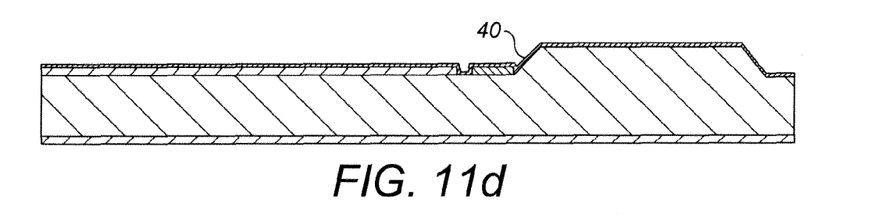
Figure 11E:
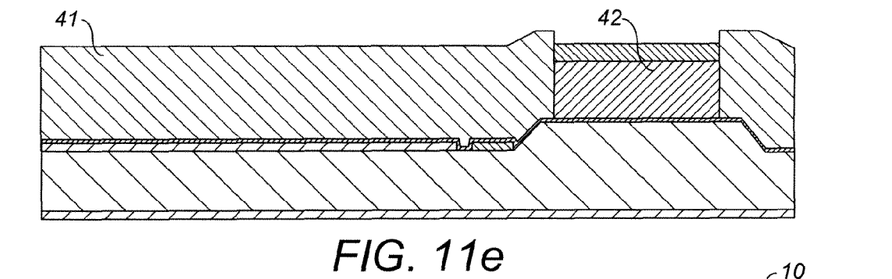
Figure 11F:
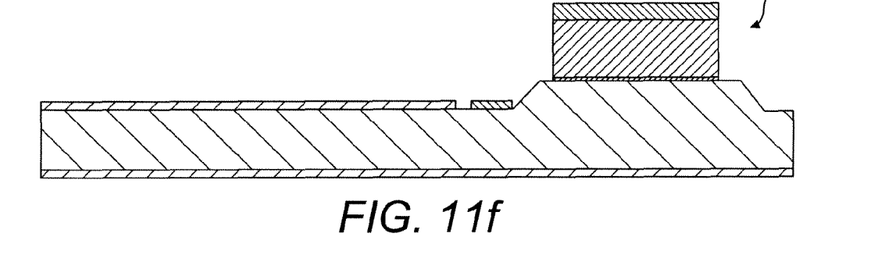

An antireflective coating 38 is then deposited (b) on one or both sides of the cap wafer 10 to minimize the reflection of the IR radiation. In the example shown, the coating 38 has been deposited on both sides of the cap wafer 10. A long-wave pass (LWP) filter can also be provided on the surface of the cap wafer 10, preferably as part of the antireflective coating 38, to block short wavelengths and prevent the heating of the pixels 2 by direct exposure to sunlight. The LWP filter is, in principle, needed only on the outer top surface of the cap wafer 10.

However, such a difference in layers on the two sides of the cap wafer 10 can introduce considerable stress and therefore cause the cap wafer 10 to bow. If severe, this bowing will prevent the cap wafer 10 from bonding. Both the LWP filter and antireflective coating 38 are therefore, preferably, deposited on both surfaces of the cap wafer 10. On the underside of the cap wafer 10 the coating 38 and filter can be patterned so that it is removed from the areas to be bonded.

Next, an optional patterned thin film non-evaporable getter 39 is deposited (c), for example by means of shadow mask technology, to trap potential residual gases in the bonded cavities and thereby ensure the required vacuum level for the whole life time of the FPA. The getter 39 should not be placed above the active pixels 2 in case it is not transparent to IR radiation. Thus it is located above the blind reference pixels and ROIC electronics. Similar to the formation of the bonding frame 11 on the ROIC wafer 9, a thin metal layer 40, for example TiW/Cu, is deposited (d) on the unetched, raised portion of the cap wafer 10 to act as an adhesive and seed, before a thick electroplating photoresist 41 is deposited and patterned (e). Finally, metal layer(s) that will form the bonding frame, in this example Cu and Sn, or just Cu, are electroplated (f) onto the surface of the cap wafer 10 to define the bonding frame 42 on the cap wafer, which is followed by the removal of the photoresist 41 and the thin metal layer 40.

As explained above, the cap wafer 10 encapsulates the focal plane array 1 by bonding the bonding frame 42 on the cap wafer 10 to the bonding frame 11 provided on the ROIC wafer 9, under vacuum to seal the pixels 2 within the focal plane array 1.

Although the manufacture of an individual focal plane array 1 is discussed in the example above, the method of the present invention is preferably used to manufacture a plurality of focal plane arrays on a single ROIC wafer 9, which are then encapsulated by a single cap wafer 10 at wafer-level, using a suitable sealing method such as Cu—Sn bonding (although other approaches such as Au—Sn bonding are equally applicable) before being diced into a plurality of individual focal plane arrays. The method of the invention therefore enables more efficient and reliable manufacture of devices through wafer-level encapsulation prior to dicing.

The invention claimed is:

1. A pixel for a focal plane array, with the pixel presenting a sensing surface, the pixel comprising:
   a reflecting layer;
   a sensing layer comprising a sensing material formed on the reflecting layer;
   a support leg attached to the reflecting layer and arranged to support, in use, the pixel on a wafer and provide electrical connection between the pixel and the wafer, said support leg formed entirely on a side of the reflecting layer opposite to the sensing layer and beneath the sensing surface when supporting the pixel on the wafer;
   a via associated with the support leg, each via providing electrical connection through the sensing layer from the support leg to the sensing surface of the pixel; and
   a conductive contact that communicates electrically with the support leg and extends through the via to intersect the sensing surface of the pixel,
   wherein said support leg is elongated and projects laterally along the pixel and relative to the conductive contact,
   wherein said support leg presents opposite leg ends spaced laterally from one another, with one of the leg ends being attached to the conductive contact and the other one of the leg ends operable to be in supporting engagement with the wafer.

2. The pixel of claim 1, wherein said support leg includes a thin film material that extends between the leg ends.

3. The pixel of claim 1, wherein said one leg end is spaced laterally outboard from said other leg end.

4. The pixel of claim 1, wherein said support leg is spaced below the reflecting layer.

5. The pixel of claim 1, wherein said sensing surface presents a laterally outermost extent and said support leg is located entirely within the laterally outermost extent of the sensing surface.

6. The pixel of claim 1, wherein said support leg includes a thin film material.

* * * * *